United States Patent
Bach et al.

(10) Patent No.: US 9,893,704 B2
(45) Date of Patent: Feb. 13, 2018

(54) CIRCUIT WITH AN RC-FILTER

(71) Applicant: Infineon Technologies Austria AG, Villach (AT)

(72) Inventors: Elmar Bach, Villach (AT); Christian Lindholm, Villach (AT)

(73) Assignee: Infineon Technologies Austria AG, Villach (AT)

( * ) Notice: Subject to any disclaimer, the term of this patent is extended or adjusted under 35 U.S.C. 154(b) by 117 days.

(21) Appl. No.: 14/810,788

(22) Filed: Jul. 28, 2015

(65) Prior Publication Data

US 2016/0036407 A1    Feb. 4, 2016

(30) Foreign Application Priority Data

Jul. 29, 2014 (DE) .......... 10 2014 110 672

(51) Int. Cl.

| | |
|---|---|
| H03H 7/06 | (2006.01) |
| G05B 13/02 | (2006.01) |
| H03H 7/03 | (2006.01) |
| H03H 1/02 | (2006.01) |
| H03H 7/01 | (2006.01) |

(52) U.S. Cl.
CPC .......... *H03H 7/06* (2013.01); *G05B 13/0205* (2013.01); *H03H 1/02* (2013.01); *H03H 7/0138* (2013.01); *H03H 7/0153* (2013.01); *H03H 7/03* (2013.01)

(58) Field of Classification Search
CPC .......... H03H 7/03; H03H 7/06; H03H 7/0153; H03H 1/02; H03H 7/0138; G05B 13/0205
USPC ................................................ 333/17.1, 172
See application file for complete search history.

(56) References Cited

U.S. PATENT DOCUMENTS

| | | | | |
|---|---|---|---|---|
| 5,397,927 A | * | 3/1995 | Suelzle ..................... | H02J 3/01 307/105 |
| 6,774,715 B2 | | 8/2004 | Wyman et al. | |

FOREIGN PATENT DOCUMENTS

DE    1187641    4/1975

OTHER PUBLICATIONS

Translator's Report re: Office Action Communication of the German Patent and Trademark Office for File Reference 10 2014 110 672.5 dated Mar. 13, 2015.

* cited by examiner

*Primary Examiner* — Rakesh Patel
(74) *Attorney, Agent, or Firm* — Baker Botts L.L.P.

(57) ABSTRACT

A circuit (290) comprises an RC filter circuit (100), which comprises an ohmic resistor (112) and a capacitor (113). In addition, the circuit (290) comprises a compensation circuit (200), which is designed to provide a compensation current flow (192), which corresponds to a current flow (191) to a load (150).

8 Claims, 4 Drawing Sheets

CIRCUIT WITH AN RC-FILTER

CROSS REFERENCE TO RELATED APPLICATION

This application claims priority to German Application Serial No. 102014110672.5 filed Jul. 29, 2014 and entitled "Circuit with a RC-Filter".

TECHNICAL FIELD

The invention relates to a circuit and a corresponding method. In particular, the invention relates to a circuit, which comprises an RC filter circuit and a compensation circuit, which provides a compensation current flow.

BACKGROUND

RC filters are known which have a frequency-dependent filter curve. Such RC filters typically comprise an ohmic resistor and a capacitor. By suitable dimensioning of a resistance of the ohmic resistor and/or a capacitance of the capacitor, specific filter characteristics, such as in particular a specific filter curve, can be achieved. For example, a 3 dB point can be fixed.

However, such RC filters can have limitations. It may thus be possible, for example, for a finite input resistance of a load which is coupled to the RC filter as downstream stage to change the filter characteristics. Thus, in this scenario, a finite current can flow through the ohmic resistor of the RC filter in the case of a finite input resistance, which in turn causes a voltage drop across the resistor. Thus, a changed voltage drop can form across the capacitor, for example, as a result of which the filter characteristics can be changed. For example, in particular tolerances or drifts in the input resistance can have an influence on the filter characteristics in this way. The ohmic resistor can heat up.

Technologies are known for reducing such an influence of the downstream load on the RC filter. Firstly, it may be possible to use a resistor with comparatively small dimensions. In this case, the voltage which forms as a voltage drop across the ohmic resistor can be comparatively low. However, this may entail the disadvantage that it may be necessary for this purpose, in order to ensure the same filter curve of the RC filter circuit, to use a comparatively high capacitance of the capacitor. This can result in increased costs.

Technologies are also known in which an operational amplifier is used as buffer for the RC filter circuit. The operational amplifier has a comparatively high input resistance, for example in the gigaohms range. In this way, only a particularly low current can flow through the ohmic resistor of the RC filter circuit. However, such an operational amplifier often causes increased current consumption, an offset, increased signal noise, increased temperature drift and generally increased complexity.

Therefore, there is a need for improved circuits which provide a voltage filtered by an RC filter circuit to a load. In particular, there is a need for technologies which ensure stability of filter characteristics of the RC filter circuit even when there is a coupled load with a finite input resistance.

BRIEF DESCRIPTION OF THE DRAWINGS

The above-described properties, features and advantages of this invention and the way in which they are achieved will become clearer and more easily understandable in connection with the following description of the exemplary embodiments, which are explained in more detail in connection with the drawings.

DETAILED DESCRIPTION

Figure 1:
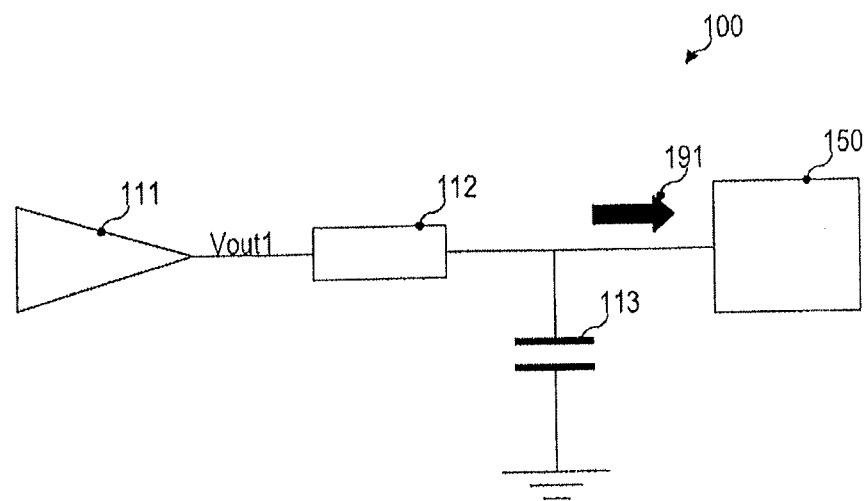
FIG. 1 shows a circuit diagram of a previously known RC filter circuit of a filter.

In accordance with a first aspect, the application relates to a circuit. The circuit comprises an RC filter circuit and a compensation circuit. The RC filter circuit has an input and an output. The input is coupled to a first voltage source. The output is coupled to a load. The RC filter circuit comprises an ohmic resistor and a capacitor. The compensation circuit is coupled to the RC filter circuit. The compensation circuit is designed to provide a compensation current flow, which corresponds to a current flow to the load.

For example, the first voltage source could be designed to provide a time-dependent first voltage, the time dependence of which has a specific frequency spectrum. Then, the RC filter circuit can be designed, for example, to filter the first voltage so that the frequency spectrum is changed. For example, the RC filter circuit can be designed to be operated as a high-pass filter or as a low-pass filter. A filter characteristic of the first voltage can be defined by a 3 dB point, for example. The filter characteristic can be fixed, for example, by dimensioning of a resistance of the ohmic resistor and/or a capacitance of the capacitor. Corresponding technologies are known in principle to a person skilled in the art.

Typically, the load can have a finite input resistance. In this case, the current flow to the load can occur. In this case, the current flow can either be directed into the load, from the point of view of the RC filter circuit, or out of the load. A directional dependence of the current flow can be taken into consideration formally by virtue of a mathematical sign, for example.

In conventional circuits, the following effect can occur owing to the current flow to the load: the current flow can cause a significant voltage drop across the ohmic resistor of the RC filter circuit. A voltage which is present across the capacitor thus changes. This may result in a change in the filter characteristic and in a significant degree of energy dissipation in the ohmic resistor. In technologies in accordance with the aspect discussed here, such effects can be avoided or reduced since the current flow to the load can be fed through the compensation current flow. In this case, no or no significant current flow through the ohmic resistor of the RC filter circuit can be present.

For example, it would be possible for the compensation current flow to substantially compensate for the current flow.

Therefore, absolute values of the current flows can be identical or substantially identical. This may mean that no or no significant current flow occurs through the ohmic resistor of the RC filter circuit or no or no significant voltage drop occurs across the ohmic resistor since the current flow to the load is fed through the compensation circuit and not through the RC filter circuit. In other words, the current flow which flows into the load or flows out of the load can be provided by the compensation circuit or can be taken up by said compensation circuit. Essentially this can mean: compensation within a tolerance threshold which can amount to ±20%, preferably ±10%, particularly preferably ±2%, for example. Mutually corresponding current flows can therefore generally mean: current flows which correlate with one another in terms of magnitude, for example as regards a current flow through the RC filter circuit. For example, the compensation current flow can correlate with the current flow to the load in such a way that a current flow through the RC filter circuit is low and/or is minimized and/or disappears. Mutually corresponding current flows can also mean: correlated dimensioning of electrical component parts which produce a magnitude of the current flows. For example, a resistance of the compensation circuit can be dimensioned in such a way that the compensation current flow substantially compensates for the current flow to the load.

Scenarios are conceivable in which a plurality of loads are coupled to the RC filter circuit. In this case, the compensation current flow can compensate for the sum of the currents into the loads. In this case, it may be possible to consider the plurality of loads alternatively and formally as one load.

In a simple implementation, the compensation circuit can be a regulated current source. For example, the regulated current source can regulate the compensation current depending on the current flow. As a result, it may be possible to match the compensation current flow dynamically depending on the load or present operating properties of the load. In this way, for example, temporal drifts or different operating modes of the load can be taken into consideration.

It would also be possible for the compensation circuit to comprise a second voltage source and a further resistor. For example, the first voltage source can be designed to provide a first voltage. The second voltage source can be designed to provide a second voltage. It is possible, for example, for the second voltage to be greater than the first voltage. For example, the further resistor can be in the form of an ohmic resistor. By suitable dimensioning of the further resistor and/or the second voltage, it may thus be possible, for example, to provide the compensation current flow with a specific magnitude, with the result that said compensation current flow corresponds to the current flow to the load. By providing the second voltage which is greater than the first voltage, a differential voltage can be implemented. The differential voltage can bring about the compensation current flow, owing to the coupling between the compensation circuit and the RC filter circuit. For example, the first voltage could be approximately 1.1 V. It would be possible for the second voltage to be approximately 1.5-2.0 V.

It would also be possible for the compensation circuit to be a switched-capacitor (SC) circuit, which comprises a further capacitor, a first switch and a second switch. In this way, the further resistance can be implemented by the SC circuit. It is possible, for example, for the further capacitor to couple the second voltage source to ground via the first switch and for the second switch to couple the second voltage source to the RC filter circuit via the first switch. If the further resistance of the compensation circuit is implemented via an SC circuit, it can be particularly simple to dimension the further resistance. For example, the further resistance can be dimensioned via a switching frequency of the first and second switches; this switching frequency can be inversely proportional to the further resistance. Typically, in addition the further resistance is dependent both on a switching frequency of the first and second switches and on a capacitance of the further capacitor. For example, it may be possible to match the compensation current flow depending on the current flow by matching the switching frequency of the first and second switches of the SC circuit of the compensation circuit. In this way too, dynamic matching of the compensation current flow to present properties of the load can take place. In particular, particularly accurate compensation of the current flow can take place by virtue of the compensation current flow. It would be possible, for example, for the SC circuit to receive corresponding control signals, for example from a sensor which measures a current flow through the resistor and/or from the load. For example, the control signals can be indicative of a current flow through the ohmic resistor of the RC filter circuit and/or of a present power consumption/current consumption of the load.

For example, in particular in those cases in which the load comprises an SC input stage, the use of an SC circuit as compensation circuit can be particularly advantageous. For example, it may be possible for a switching frequency of the first and second switches of the compensation circuit to be equal to a switching frequency of a first and second switch of the SC input stage of the load. In this way, it may be possible, for example, to use control signals for actuating the first and second switches of the compensation circuit, which are also used for actuating the first and second switches of the SC input stage of the load.

In a simple implementation, it would be possible, for example, for the second switch of the compensation circuit to connect the compensation circuit directly to the RC filter circuit. For example, the second switch of the compensation circuit could connect the compensation circuit to the RC filter circuit at a point at which the RC filter circuit is connected to the load. This can typically be a point of the RC filter circuit which is downstream of the ohmic resistor and upstream of the capacitor, from the point of view of the first voltage source. Point can in this case mean, for example, that region of the circuit which is at the same potential.

It would also be possible for the second switch of the compensation circuit to connect the second voltage source to the RC filter circuit via the first switch of the RC input stage of the load. In this way, for example, a particularly advantageous arrangement of the various elements of the circuit on a chip could take place. In particular, it would be possible to provide in a particularly efficient manner a control signal for actuating the various switches of the compensation circuit and/or the SC input stage of the load.

In general, various technologies for the provision of the second voltage by the second voltage source are possible. For example, the second voltage source could be connected to a supply voltage of the chip on which the circuit is located, for example via a linear controller which enables suitable dimensioning of the second voltage. It would also be possible for the second voltage source to furthermore provide an operating voltage for an active element of the load. For example, the active element could be an operational amplifier or a digital-to-analog converter. It may also be possible in this way to implement the circuit using comparatively few electrical component parts.

For example, the compensation circuit can be designed to provide the compensation current flow depending on a control signal. For example, the control signal can be obtained from a measuring element of the circuit and/or from the load. For example, the control signal can be indicative of a current flow through the ohmic resistor of the RC filter circuit. As an alternative or in addition, it would be possible for the control signal to be indicative of the current flow to the load. In this way, it may be possible to match the compensation current flow dynamically to present conditions.

In accordance with a further aspect, the present application relates to a method for operating a circuit. The method comprises the provision of a first voltage for a load. The provision of the first voltage takes place via an RC filter circuit, which comprises an ohmic resistor and a capacitor. In addition, the method comprises the provision of a compensation current flow. The compensation current flow corresponds to a current flow to the load.

In particular, the method in accordance with the present aspect can be designed in accordance with the circuit according to a further aspect. In this way, effects can be achieved for the present method which are comparable to the effects which can be achieved for the circuit according to a further aspect.

The above-described features and features which are described below can be used not only in the corresponding explicitly outlined combinations, but also in further combinations or on their own without departing from the scope of protection of the present invention.

The present invention will be explained in more detail below using preferred embodiments with reference to the drawings. Identical reference symbols denote identical or similar elements in the figures. The figures are schematic representations of various embodiments of the invention. Elements illustrated in the figures are not necessarily illustrated true to scale. Instead, the various elements illustrated in the figures are reproduced in such a way that their function and general purpose become understandable to a person skilled in the art. Connections and couplings between functional units and elements illustrated in the figures can also be implemented as an indirect connection or coupling. A connection or coupling can be wired or wireless. Functional units can be implemented as hardware, software or a combination of hardware and software.

Technologies are explained below which make it possible to provide a compensation charge or a compensation current flow to a point in a circuit. In particular, technologies are explained which relate to a circuit which comprises an RC filter circuit. A current flow which would flow between the RC filter circuit and a load coupled thereto without any application of corresponding technologies can thus be reduced. As a result, it is possible for no or no significant current flow to flow through an ohmic resistor of the RC filter circuit or for there to be no or no significant voltage drop. This can have advantages in relation to the dimensioning of the resistance of the ohmic resistor and/or in relation to the dimensioning of a capacitance of a capacitor of the RC filter circuit.

FIG. 1 illustrates a conventional RC filter circuit 100. The RC filter circuit 100 comprises a first voltage source 111, which provides a first voltage (denoted by Vout1 in FIG. 1). In addition, an ohmic resistor 112 and a capacitor 113 are illustrated. The RC filter circuit 100 is coupled to a load 150. The load takes up a current flow 191. This is provided by the RC filter circuit 100; the corresponding current flow also flows through the resistor 112. As a result, a voltage drop across the resistor 112 is produced. Owing to the current flow 191, the filter characteristic of the RC filter circuit changes in comparison with an ideal case, in which there is no current flow 191. In addition, energy is dissipated in the resistor 112.

Figure 2:
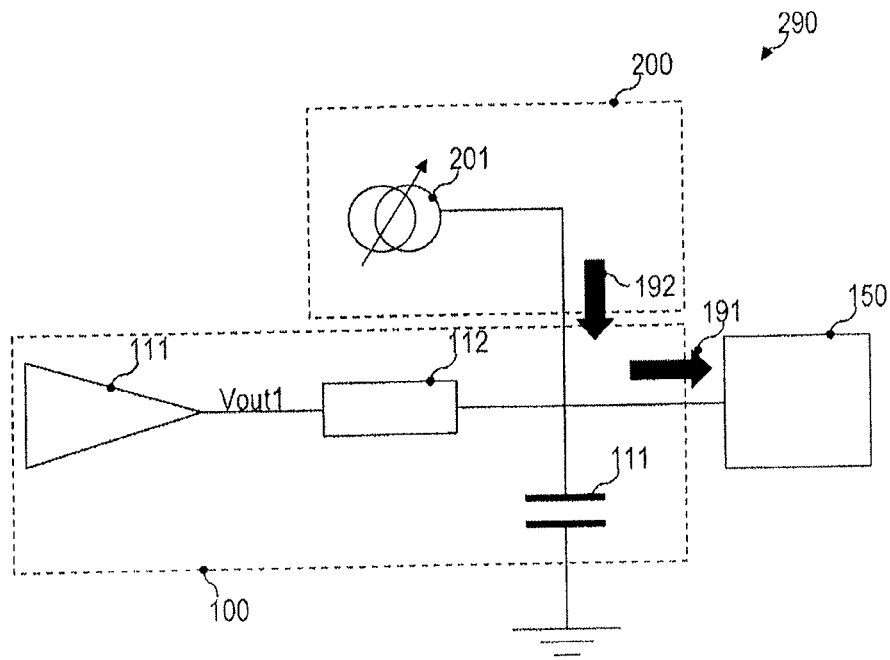
FIG. 2 shows a circuit diagram of a circuit comprising an RC filter circuit in accordance with various embodiments, wherein a compensation circuit comprises a regulated current source.

Therefore, it may be desirable to implement technologies in accordance with the present application, as are illustrated in FIG. 2. FIG. 2 shows a circuit 290 in which, in addition to the RC filter circuit 100, a compensation circuit 200 is provided. In FIG. 2, the charge or current flow 191 which is dissipated through the load 150 is compensated for by the compensation circuit 200. FIG. 2 shows a compensation current flow 192, which corresponds to the current flow 191. Correspond can mean, for example: substantially equal in magnitude. Generally, it is also possible for the load 150 to provide charge or for the current flow 191 to be oriented from the load 150.

By virtue of these technologies, the current flow through the ohmic resistor 112 can be reduced. As a result, it is possible for the original filter characteristic of the RC filter circuit 100 to be maintained.

In the scenario shown in FIG. 2, the compensation current flow 192 is produced by a regulated current source 201. For example, it would be possible for the regulated current source 201 to monitor the current flow 191 and to set the compensation current flow 192 depending on the monitoring. For this purpose, it may be possible, for example, for the load 150 to provide a control signal which is indicative of the current flow 191. It would also be possible for a measuring element of the circuit 290 (not shown in FIG. 2) to measure the current flow through the ohmic resistor 112 and to provide a corresponding control signal. In this connection, it would be possible, for example, for the regulated current source 201 to obtain a variable as regulation signal which indicates a current flow through the ohmic resistor 112 of the RC filter circuit 100. It would be possible, for example, for the regulated current source 201 to vary the compensation current flow 192 until the corresponding controlled variable indicates a minimized current flow through the ohmic resistor 112. In general, however, it would also be possible for the operation of the regulated current source 201 to follow fixedly preset parameters which are stored in a memory, for example. For example, the regulated current source 201 could be designed, for example on the basis of steady-state properties of the load 150, in such a way that the compensation current flow 192 compensates for the current flow 191. In such a case, therefore, the current flow 191 can be estimated by a preceding approximation.

Figure 3:
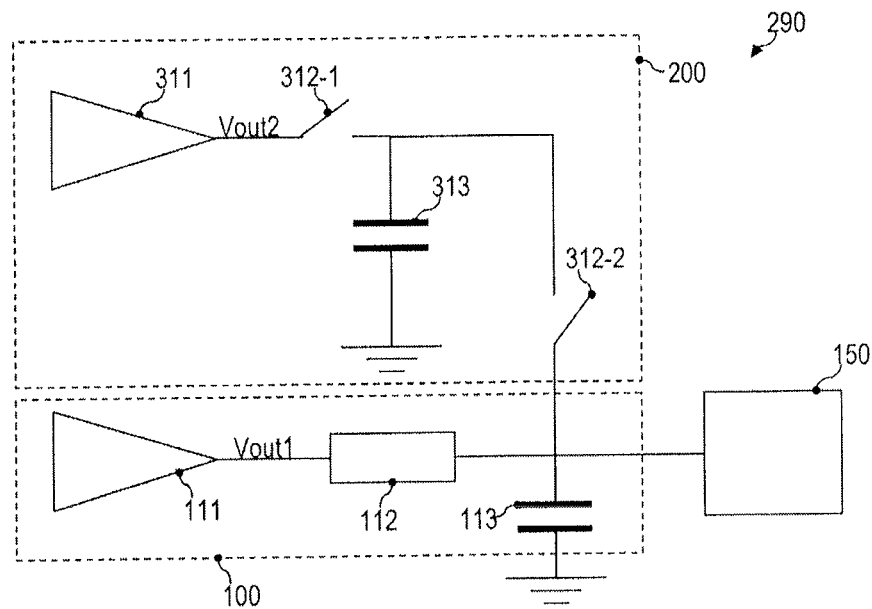
FIG. 3 shows a circuit diagram of a circuit comprising an RC filter circuit in accordance with various embodiments, wherein a compensation circuit comprises an SC circuit.

FIG. 3 shows a further implementation of the compensation circuit 200. In this case, an SC circuit is used to provide the compensation current flow 192 (not shown in FIG. 3). In this scenario, the compensation circuit 200 comprises a second voltage source 311 and a further capacitor 313. In addition, the compensation circuit 200 comprises a first switch 312-1 and a second switch 312-2. The further capacitor 313 couples the second voltage source 311 to ground via the first switch 312-1. The second switch 312-2 couples the second voltage source 311 to the RC filter circuit 100 via the first switch 312-1. Typically, the first switch 312-1 and the second switch 312-2 are closed simultaneously at no point in time. It would be possible, for example, for the first switch 312-1 and the second switch 312-2 to be actuated in opposition. The SC circuit thus provides a further resistance, which is connected in series with the second voltage source 311. The further resistance is typically dependent with inverse proportionality on a product of the capacitance of the further capacitor 313 and a switching frequency of the first and second switches 312-1, 312-2. By suitably selecting the switching frequency, it is thus possible for the compensation current flow 192 to be matched dynamically. In particular, it may be possible, for example, to regulate the switching frequency of the first and second switches 312-1, 312-2 dynamically by means of a corresponding control signal. In this way, it may be possible, for example, to match the compensation current flow 192 depending on the specifically occurring current flow 191 (not shown in FIG. 3).

As can be seen from FIG. 3, the second voltage source provides a second voltage (denoted by Vout2 in FIG. 3). It is possible for the second voltage to be greater than the first voltage, which is provided by the first voltage source 111, for example 20% greater or 50% grater, etc. In addition to the above mentioned dependence of the compensation current flow 192 on the capacitance of the further capacitor 313, the compensation current flow 192 can also be dimensioned by suitable selection of the second voltage.

Figure 4:
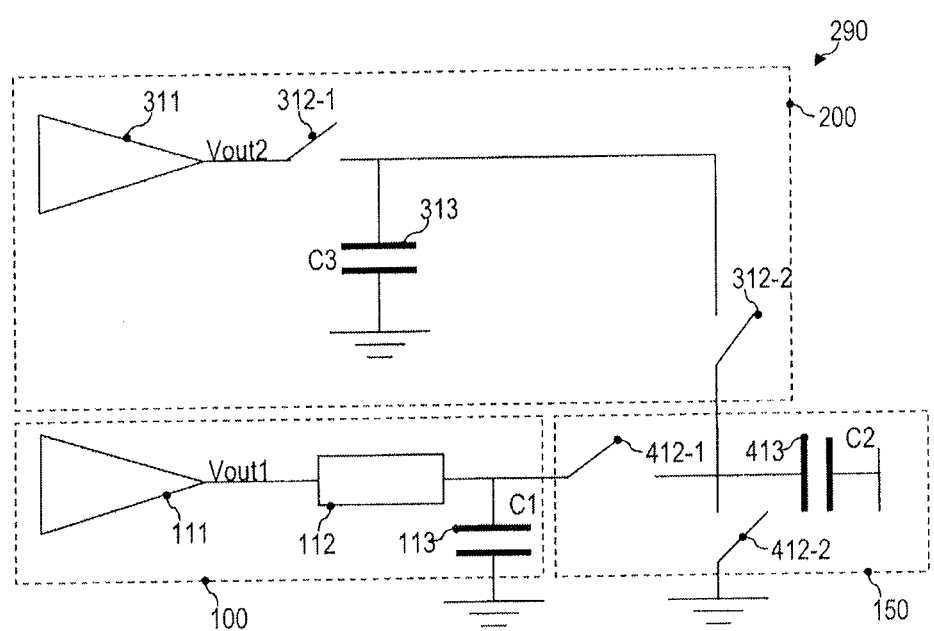
FIG. 4 shows a circuit diagram of a circuit comprising an RC filter circuit as shown in FIG. 3, wherein a load comprises a switched-capacitor input stage, via which the compensation circuit is coupled to the RC filter circuit.

FIG. 4 shows a case in which the load 150 comprises an SC input stage. The SC input stage comprises a first switch 412-1, a second switch 412-2 and a capacitor 413. For example, in the scenario shown in FIG. 4, the load 150 can be an analog-to-digital converter or a digital-to-analog converter. In the scenario shown in FIG. 4, mentioned by way of example, the capacitor 413 of the load 150 can take up a certain quantity of charge; owing to the differential voltage between the first and second voltages, this taken-up charge can be given back by the further capacitor 313 of the compensation circuit. Slight mismatches between the taken-up charge and the given-back charge are possible in this case; the charges should substantially correspond to one another. However, it may be possible, for example on the basis of knowledge of the load 150, to perform comparatively accurate dimensioning of the capacitance of the further capacitor 313 of the compensation circuit 200. At the same time, it may be possible to fix the differential voltage between the first voltage and the second voltage comparatively precisely.

In particular, it may be possible for a switching frequency of the first and second switches 312-1, 312-2 of the compensation circuit 200 to be equal to a switching frequency of the first and second switches 412-1, 412-2 of the load 150. In this way, it may be possible, for example, to use one and the same control signal both for actuating the first and second switches 312-1, 312-2 of the compensation circuit 200 and for actuating the first and second switches 412-1, 412-2 of the load 150. This can enable particularly simple implementation of the circuit 290.

Again with reference to FIG. 3: in said figure it is clear that the compensation circuit 200 can be connected directly to the RC filter circuit 100. In comparison thereto, FIG. 4 shows a scenario in which coupling of the compensation circuit 200 to the RC filter circuit 100 is implemented indirectly via the load 150. Such a scenario can be desirable in particular if a plurality of loads 150 are used (not shown in FIG. 4). In this case, the second switch 312-2 of the compensation circuit 200 is connected to the RC filter circuit 100 via the first switch 412-1 of the SC input stage of the load 150.

For example, the load 150 could comprise further active elements, such as operational amplifiers, for example, etc. (not shown in FIG. 4). In such a case, it may be desirable for the chip on which the circuit 290 is implemented to provide a supply voltage, for example. In one embodiment, it would be possible, for example, for both the first voltage source 111 and the second voltage source 311 to be implemented by coupling to the supply voltage. In particular, it would be possible, for example, for the second voltage 311 to be coupled to the supply voltage via a linear controller. At the same time, for example, the first voltage source 111 could equally correspond to a further voltage source of the load 150 (not shown in FIG. 4). In this way, it may be possible to implement the first and second voltage sources 111, 311 in a particularly simple manner, for example by virtue of one and the same linear controller being used.

In addition, the capacitance C1 of the capacitor 113 of the RC filter circuit 100, the capacitance C3 of the further capacitor 313 of the compensation circuit 200 and the capacitance C2 of the capacitor 413 of the SC input stage of the load 150 are indicated graphically in FIG. 4. Assuming that the charge which is required for continuously switching the capacitor 413 of the load 150 between the first voltage $V_{out1}$ and ground is provided by the further capacitor 313 of the compensation circuit 200 alone, which corresponds to a disappearing current flow through the ohmic resistor 112: it is possible in such a scenario to calculate the capacitance C3 of the further capacitor 313 in various ways, for example $$Q_3 = C_3 V_{out2} \tag{1}$$

for the charge of the further capacitor 313. First, it is assumed that the capacitor 413 of the load 150 does not carry a charge and then the capacitors 413, 313 are connected to one another by closing of the switch 312-2. The total charge ideally remains the same, which means:

$$Q_3 = (C_3 + C_2) V_{out1} \tag{2}$$

In this case, the first voltage Vout1 of the first voltage source 111 is used since this is the target voltage assuming that there is no current flow through the ohmic resistor 112. This gives:

$$C_3 V_{out2} = (C_3 + C_2) V_{out1} \tag{3}$$

which, when solved for $C_2$, gives:

$$C_3 = \frac{V_{out1} C_2}{V_{out2} - V_{out1}}. \tag{4}$$

A further technology for determining the capacitance C3 of the further capacitor 313 would be to consider, for example, the current flow 191 into the load 150:

$$I_2 = C_2 V_{out1} f_{sw} \tag{5}$$

wherein $f_{sw}$ denotes the switching frequency of the switches 312-1, 312-2, 412-1, 412-2 of the compensation circuit 200 and the load 150.

The current flow which is provided by the further capacitor 313 is dependent on the differential voltage between the first voltage Vout1 and the second voltage Vout2 of the first and second voltage sources 111, 311:

$$I_3 = C_3 (V_{out2} - V_{out1}) f_{sw} \tag{6}$$

Assuming that the current flow 191, $I_2$ is equal to the compensation current flow 192, $I_3$, i.e.

$$I_2 = I_3 \tag{7}$$

the following equation is obtained, which can be solved:

$$C_2 V_{out1} f_{sw} = C_3 (V_{out2} - V_{out1}) f_{sw} \tag{8}$$
$$C_2 V_{out1} = C_3 (V_{out2} - V_{out1})$$
$$C_3 = \frac{V_{out1} C_2}{V_{out2} - V_{out1}}.$$

It is clear from the above that, for example, by suitable dimensioning of the capacitance C3 of the further capacitor 213 and/or of the differential voltage between the first voltage Vout1 and the second voltage Vout2, it is possible for the current flow 191 and the compensation current flow 192 to substantially compensate for one another.

Figure 5A:
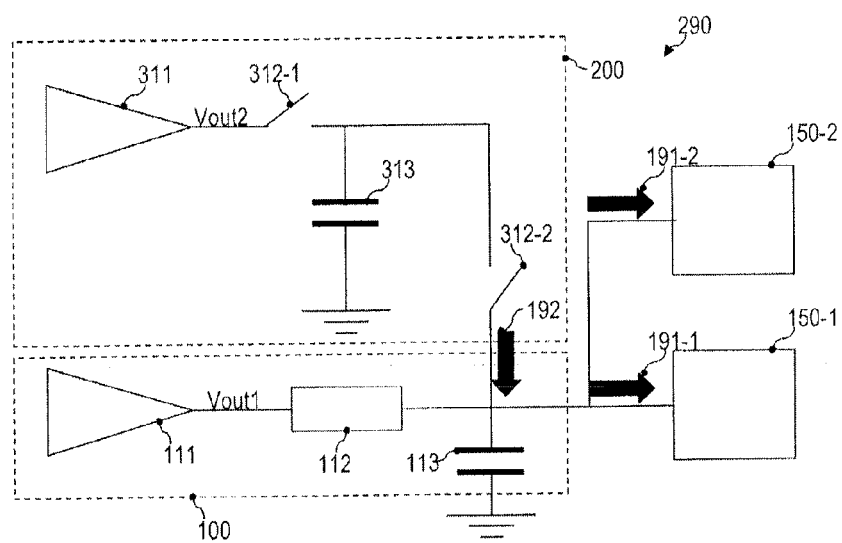
FIG. 5A shows a circuit diagram of a circuit as shown in FIG. 3, wherein two loads are provided.

FIG. 5A shows a scenario corresponding to FIG. 3, wherein two loads 150-1, 150-2 are coupled to the RC filter circuit 100 in FIG. 5A. In this scenario, it is possible to ensure, for example by suitable dimensioning of the further capacitor 313 of the compensation circuit, that a compensation current flow 192 is provided, which corresponds to a first current flow 191-1 to the first load 150-1 and which corresponds to a second current flow 191-2 to the second load 150-2. In this case, for example, the compensation current flow 192 can correspond to a sum of the first and second current flows 191-1, 191-2, as a result of which in turn it can be provided that there is no or no significant voltage drop across the ohmic resistor 112. In the scenario shown in FIG. 5A, it is also possible to consider the first and second loads 150-1, 150-2, formally, as one load. For example, the first load 150-1 and/or the second load 150-2 could have an SC input stage (cf. FIG. 4).

Figure 5B:
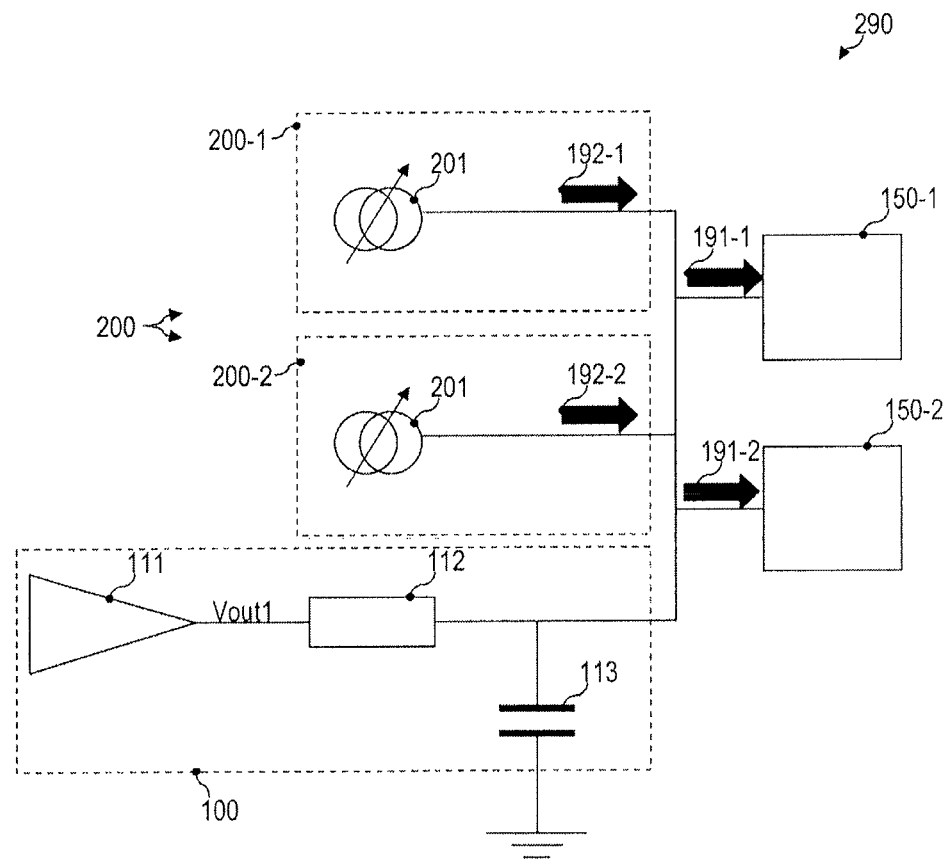
FIG. 5B shows a circuit diagram of a circuit as shown in FIG. 5A, wherein two compensation circuits are provided.

FIG. 5B shows, in a manner comparable to that in FIG. 5A, a further scenario in which a first and a second load 150-1, 150-2 is used. In this implementation, two compensation circuits 200-1, 200-2 are used. The first compensation circuit 200-1 provides a first compensation current flow 192-1; the second compensation circuit 200-2 provides a second compensation current flow 192-2. By suitable matching of the first and second compensation circuits 200-1, 200-2 in accordance with the above-explained technologies, it is possible for there to be no or no significant voltage drop across the ohmic resistor 112. For example, a sum of the compensation current flows 192-1, 192-2 can correspond to a sum of the currents 191-1, 191-2. The first and second compensation circuits 200-1, 200-2 can, formally, be considered as one compensation circuit 200, as illustrated in FIG. 5B.

It is generally possible to use more than two loads 150-1, 150-2 and/or to use more than two compensation circuits 200-1, 200-2.

Figure 6:
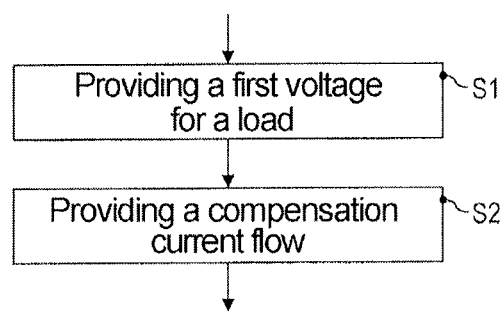
FIG. 6 shows a flowchart of a method in accordance with various embodiments.

FIG. 6 shows a flowchart of a method in accordance with various embodiments. The method begins with step S1. In said step, the first voltage is provided by the first voltage source 111 for the load 150. The RC filter circuit 100 filters the first voltage. For example, a high-pass or low-pass filter is used for the first voltage.

The load 150 has a finite input resistance and therefore the current flow 191 flows to the load 150, i.e. into the load 150 or out of the load 150. In order to reduce or minimize a current flow through the ohmic resistor 112, in step S2 the compensation current 192 is provided by the compensation circuit 200. Said compensation current can substantially compensate for the current flow 191 to the load.

The features of the above-described embodiments and aspects of the invention can of course be combined with one another. In particular, the features can be used not only in the described combinations, but also in other combinations or on their own without departing from the field of the invention.

While previously various current flows with a specific direction have been discussed, for example, it is generally possible for the current flows to be oriented alternatively in a different direction. While primarily load with an SC input stage has been illustrated above, it is possible to use other types of loads.

What is claimed is:

1. A circuit, which comprises:
an RC filter circuit comprising an input and an output,
wherein the input is coupled to a first voltage source,
wherein the output is coupled to a load,
wherein the RC filter circuit comprises an ohmic resistor and a capacitor,
a compensation circuit which is coupled to the RC filter circuit,
wherein the compensation circuit is designed to provide a compensation current flow, which corresponds to a current flow to the load, and
wherein the circuit furthermore comprises:
a measurement element, which measures a current flow through the ohmic resistor of the RC filter circuit and provides a control signal which is indicative of the measured current flow through the ohmic resistor, and
wherein the compensation circuit is designed to provide the compensation current flow depending on the control signal of the measuring element.

2. A method for operating a circuit,
wherein the method comprises the following steps:
providing a first voltage for a load,
wherein the providing of the first voltage takes place via an RC filter circuit, which comprises an ohmic resistor and a capacitor,
providing a compensation current flow, which corresponds to a current flow to the load, and
wherein the compensation circuit comprises a second voltage source and a further resistor,
wherein the first voltage is provided by a first voltage source,
wherein the second voltage source is designed to provide a second voltage, and
wherein the second voltage is greater than the first voltage.

3. A circuit, which comprises:
an RC filter circuit comprising an input and an output,
wherein the input is coupled to a first voltage source,
wherein the output is coupled to a load,
wherein the RC filter circuit comprises an ohmic resistor and a capacitor,
a compensation circuit which is coupled to the RC filter circuit,
wherein the compensation circuit is designed to provide a compensation current flow, which corresponds to a current flow to the load,
wherein the compensation circuit comprises a second voltage source and a further resistor,
wherein the first voltage source is designed to provide a first voltage,
wherein the second voltage source is designed to provide a second voltage, and
wherein the second voltage is greater than the first voltage.

4. The circuit as claimed in claim 3,
wherein the compensation circuit is a switched-capacitor circuit, which comprises a further capacitor, a first switch and a second switch,
wherein the further capacitor couples the second voltage source to ground via the first switch,
wherein the second switch couples the second voltage source to the RC filter circuit via the first switch.

5. The circuit as claimed in claim 4,
wherein the load comprises a switched-capacitor input stage, wherein a switching frequency of the first switch and the second switch of the compensation circuit is equal to a switching frequency of a third switch and a fourth switch of the switched-capacitor input stage of the load.

6. The circuit as claimed in claim 5, wherein the second switch of the compensation circuit connects the second voltage source to the RC filter circuit via the third switch of the switched-capacitor input stage of the load.

7. The circuit as claimed in claim 4, wherein the second voltage source furthermore provides an operating voltage for an active element of the load.

8. The circuit as claimed in claim 3, wherein the compensation circuit is designed to receive a control signal from the load, wherein the control signal is indicative of the current flow to the load, wherein the compensation circuit is designed to provide the compensation current flow depending on the control signal of the load.

\* \* \* \* \*